(12) United States Patent
Do et al.

(10) Patent No.: US 8,148,231 B2
(45) Date of Patent: Apr. 3, 2012

(54) METHOD OF FABRICATING CAPACITOR

(75) Inventors: Kwan-Woo Do, Icheon-si (KR);
Kee-Jeung Lee, Icheon-si (KR);
Deok-Sin Kil, Icheon-si (KR);
Young-Dae Kim, Icheon-si (KR);
Jin-Hyock Kim, Icheon-si (KR);
Kyung-Woong Park, Icheon-si (KR);
Jeong-Yeop Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 220 days.

(21) Appl. No.: 12/344,182

(22) Filed: Dec. 24, 2008

(65) Prior Publication Data

US 2010/0046138 A1  Feb. 25, 2010

(30) Foreign Application Priority Data

Aug. 20, 2008  (KR) .................. 10-2008-0081575

(51) Int. Cl.
*H01L 21/44* (2006.01)
(52) U.S. Cl. .. 438/396; 438/652; 257/766; 257/E29.139
(58) Field of Classification Search .................. 257/747, 257/748, 753, 766, E29.111, E29.139; 438/393, 438/396, 652
See application file for complete search history.

(56) References Cited

U.S. PATENT DOCUMENTS

| | | | |
|---|---|---|---|
| 6,548,437 B2* | 4/2003 | Sato et al. | 501/139 |
| 6,689,220 B1* | 2/2004 | Nguyen | 118/695 |
| 6,800,889 B2* | 10/2004 | Takatani et al. | 257/295 |
| 6,808,978 B2* | 10/2004 | Kim | 438/239 |
| 7,430,106 B2* | 9/2008 | Sugioka et al. | 361/305 |
| 7,618,474 B2* | 11/2009 | Akimoto et al. | 75/252 |
| 7,625,817 B2* | 12/2009 | Gstrein et al. | 438/618 |
| 2004/0260028 A1* | 12/2004 | Sone | 525/271 |
| 2005/0152095 A1* | 7/2005 | Nakano et al. | 361/321.4 |
| 2007/0203015 A1* | 8/2007 | Tuan et al. | 501/137 |
| 2007/0257323 A1* | 11/2007 | Tsui et al. | 257/382 |
| 2007/0263339 A1* | 11/2007 | Sugioka et al. | 361/305 |
| 2007/0269673 A1* | 11/2007 | Choi et al. | 428/546 |

FOREIGN PATENT DOCUMENTS

KR  10-0472730  2/2005

OTHER PUBLICATIONS

Do et al., "Formation of Low-Resistivity Nickel Silicide with High Temperature Stability from Atomic-Layer-Deposited Nickel Thin Film", Japan. J. of Applied Physics, vol. 45, No. 4B, Apr. 2006, pp. 2975-2979.*

Utriainen et al., "Studies of metallic thin film growth in an atomic layer epitaxy reactor using M(acac)2 (M=Ni, Cu, Pt) precursors", Applied Surface Science, 157, (Apr. 2000), pp. 151-158.*

Korean Office action for application No. 10-2008-0081575, citing the attached reference(s).

* cited by examiner

*Primary Examiner* — William F Kraig
(74) *Attorney, Agent, or Firm* — Lowe Hauptman Ham & Berner, LLP (57) ABSTRACT

A semiconductor device and a method of fabricating the same include an electrode having a nickel layer with impurities. The electrode having a nickel layer with impurities can be a gate electrode or a capacitor electrode. The electrode having a nickel layer with impurities may include a combination of a pure nickel layer and a nickel layer with impurities.

12 Claims, 10 Drawing Sheets

METHOD OF FABRICATING CAPACITOR

CROSS-REFERENCE TO RELATED APPLICATIONS

The present application claims priority of Korean patent application number 2008-0081575, filed on Aug. 20, 2008, which is incorporated herein by reference in its entirety.

BACKGROUND

The disclosure relates to a semiconductor device, and more particularly, to an electrode and a capacitor in a semiconductor device, and a method of fabricating the same.

Recently, in a process for fabricating a Metal Insulator Metal (MIM) capacitor, a method for fabricating a dielectric layer with a high dielectric constant (k) or an electrode having a high work function has been proposed to obtain required capacitance even when a semiconductor device is integrated.

However, the dielectric layer with the high dielectric constant (k) cannot be applied to semiconductor devices due to deterioration of current leakage despite the fact that the dielectric layer with the high dielectric constant (k) has a low energy band gap.

To overcome the limitation of the dielectric layer, precious metals are used to form the electrode. However, the precious metal cannot be applied to the process since the precious metal with a high work function has a low adhesion force due to a low coupling force.

Thus, it is required to develop an electrode with the high work function and the high adhesion force.

SUMMARY

One or more embodiments provide a semiconductor device having an electrode and/or a capacitor and method of fabricating the same.

In accordance with one or more embodiments, an electrode for a semiconductor device includes a nickel layer with impurities.

The impurities may include carbon (C) or hydrogen (H). The concentration of the impurities in the nickel layer with impurities may range from approximately 5% to approximately 50%.

In accordance with one or more embodiments, an electrode for a semiconductor device includes a combination of a pure nickel layer and a nickel layer with impurities.

The pure nickel layer and the nickel layer with impurities may be formed to have a stack structure.

The combination of the pure nickel layer and the nickel layer with impurities may have a stack structure of a nickel layer with impurities, a pure nickel layer, and a nickel layer with impurities.

In accordance with one or more embodiments, a capacitor includes: a first electrode; a dielectric layer; and a second electrode, wherein one of the first electrode and the second electrode includes a nickel layer with impurities.

One of the first electrode and the second electrode may include a pure nickel layer and a nickel layer with impurities.

The nickel layer with impurities may be formed to be in contact with the dielectric layer.

One of the first electrode and the second electrode may have a stack structure of a nickel layer with impurities, a pure nickel layer, and a nickel layer with impurities.

One of the first electrode and the second electrode may have a stack structure of a pure nickel layer and a nickel layer with impurities.

The impurities may include carbon (C) or hydrogen (H). The concentration of the impurities in the nickel layer with impurities may range from approximately 5% to approximately 50% of the nickel layer with impurities.

The first electrode or the second electrode may be of a concave type, a cylinder type, or a pillar type.

In accordance with one or more embodiments, a method of fabricating a capacitor includes: forming a first electrode; forming a dielectric layer over the first electrode; and forming a second electrode over the dielectric layer, wherein one of the first electrode and the second electrode includes a nickel layer with impurities.

The impurities may include carbon (C) or hydrogen (H). The concentration of the impurities in the nickel layer with impurities may range from approximately 5% to approximately 50%.

One of the first electrode and the second electrode may have a combination of a pure nickel layer and a nickel layer with impurities.

The nickel layer with impurities may be formed to be in contact with the dielectric layer.

One of the first electrode and the second electrode may have a stack structure of a pure nickel and a nickel layer with impurities.

The first electrode or the second electrode may have a stack structure of a nickel layer with impurities, a pure nickel layer, and a nickel layer with impurities.

The pure nickel layer and the nickel layer with impurities may be formed through a Chemical Vapor Deposition (CVD) process or an Atomic Layer Deposition (ALD) process.

The pure nickel layer and the nickel layer with impurities may be formed through the ALD process using a nickel precursor and a reaction gas.

The nickel precursor may flow at a rate of approximately 50 sccm to 1,000 sccm. The reaction gas may flow at a rate of approximately 100 sccm to approximately 3,000 sccm for formation of the nickel layer with impurities, and the reaction gas may flow at a rate of approximately 3,000 sccm to approximately 5,000 sccm for formation of the pure nickel layer.

The reaction gas may include $H_2$ or $NH_3$.

$H_2$ plasma or $NH_3$ plasma may be applied during the ALD process.

The ALD process may be performed at a temperature of approximately 200° C. to approximately 500° C.

The pure nickel layer and the nickel layer with impurities may be formed In-situ or Ex-situ.

The first electrode or the second electrode may be of a concave type, a cylinder type or a pillar type.

DESCRIPTION OF EMBODIMENTS

One or more embodiments relate to an electrode and/or a capacitor electrode in a semiconductor device, and a method of fabricating the same. In accordance with one or more embodiments, an electrode includes a nickel layer containing impurities, such as carbon (C) or hydrogen (H), to improve adhesion force. Furthermore, leakage current characteristics and crystallization characteristics of a dielectric layer can be improved.

The advantages, features and aspects of one or more embodiments will become apparent from the following description of the embodiments with reference to the accompanying drawings.

In the drawings, the illustrated thicknesses of layers and regions are exaggerated to facilitate explanation. It will also be understood that when a layer is referred to as being "on/under" another layer or substrate, it can be directly on/under the other layer or substrate, or intervening layers may also be present. In addition, when a layer is referred to as being 'between' two layers, it can be the only layer between the two layers, or one or more intervening layers may also be present. Furthermore, the same or like reference numerals represent the same or like elements throughout the drawings.

Figure 1:
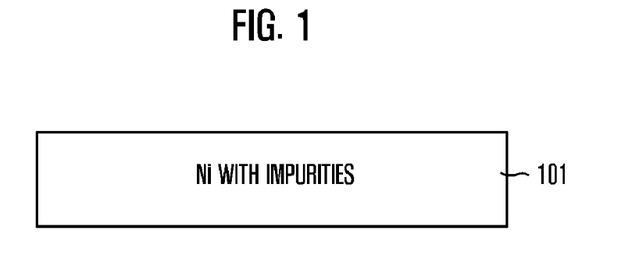
FIG. 1 is a cross-sectional view illustrating an electrode in accordance with an embodiment.

FIG. 1 is a cross-sectional view illustrating an electrode in accordance with an embodiment.

Referring to FIG. 1, an electrode with a nickel layer containing impurities in a semiconductor device is formed. The electrode may be applied to a gate electrode or at least one of upper and lower electrodes of a capacitor. The electrode may be applied to any other devices employing a high dielectric layer.

The nickel layer has a high work function of approximately 4.8 eV to approximately 5.15 eV and exhibits excellent adhesion force with other layers. Thus, when the nickel layer is used as an electrode of the device with the high dielectric layer, current leakage characteristics can be improved.

A pure nickel layer has poor roughness because of a three-dimensional structure growth and may be oxidized during a process of depositing a dielectric layer over the pure nickel layer. According to an embodiment, a nickel layer 101 containing impurities can improve the roughness and prevent the oxidation.

The impurities in the nickel layer 101 do not affect the characteristics of the pure nickel layer. Preferably, the impurities may be carbon (C) or hydrogen (H). The impurities may range from approximately 5% to approximately 50% of the nickel layer 101.

The nickel layer 101 containing impurities, for example, a nickel layer 101 containing carbon (C), is formed to have Ni—C coupling and grows in a two-dimensional direction so that the nickel layer 101 has a planar surface. The Ni—C coupling enables Ni and C to combine with each other and therefore, the nickel layer 101 containing carbon (C) has less crystallization characteristics than the pure nickel layer, and carbon (C) is randomly distributed and deposited in the nickel layer 101. Thus, the nickel layer 101 firstly grows in the second-dimensional direction to form the planar surface and then a deposition process is performed forming a film layer with the planar surface.

Since the nickel layer 101 containing the impurities has relatively less chemical bondings between Ni and C than the pure nickel layer due to the presence of the impurities, the oxidation is prohibited.

Figure 2A:
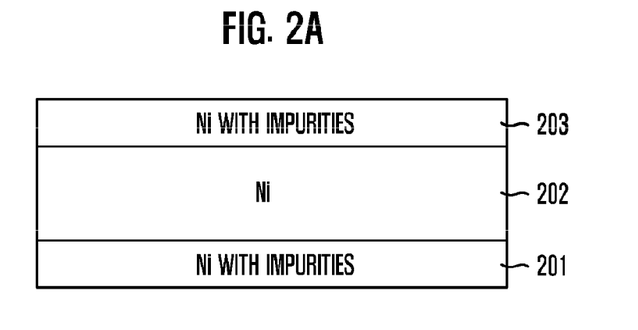
FIGS. 2A to 2C are cross-sectional views illustrating a method for fabricating the electrode in accordance with one or more embodiments.
Figure 2B:
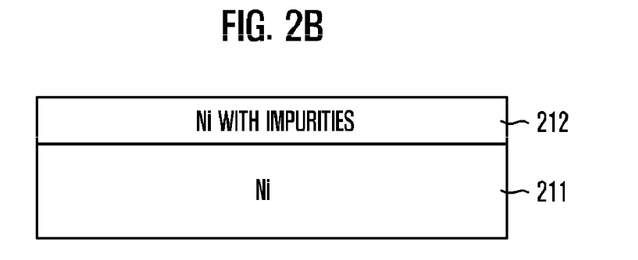
Figure 2C:
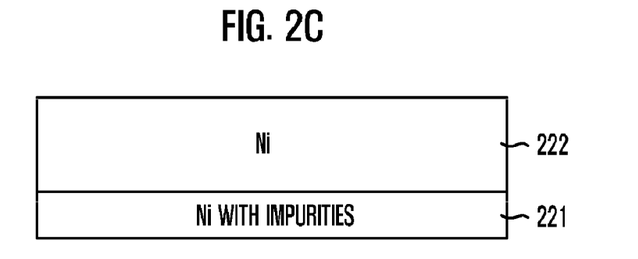

FIGS. 2A to 2C are cross-sectional views illustrating a method for fabricating the electrode in accordance with another embodiment.

Referring to FIG. 2A, an electrode with a stack structure of a first nickel layer 201 containing impurities, a pure nickel layer 202, and a second nickel layer 203 containing impurities is formed. The electrode can be applied to a gate electrode or at least one of an upper electrode and a lower electrode of a capacitor. The electrode may be used as an electrode in any other device employing a high dielectric layer.

The pure nickel layer 202 has a high work function of approximately 4.8 eV to approximately 5.15 eV and exhibits excellent adhesion force with other layers. Thus, when the nickel layer is employed as an electrode of the device with the high dielectric layer, current leakage characteristics can be improved.

The first nickel layer 201 containing impurities and the second nickel layer 203 containing impurities are formed to improve the roughness and prevent the oxidation.

The impurities in the first and second nickel layers 201 and 203 containing impurities do not affect the quality of the pure nickel layer 202. Preferably, the impurities may be carbon (C) or hydrogen (H). When a ratio of C to Ni is 1:3, that is, when a compound contains C of approximately 25% and Ni of approximately 75%, the compound is called a Nickel carbide ($Ni_3C$).

Since the pure nickel layer 202 grows in a three-dimensional direction, the surface roughness is not excellent. However, the first and second nickel layers 201 and 203 containing the impurities, for example, having a Ni—C coupling, grow in a second-dimensional direction, forming a planar surface.

In the Ni—C coupling, Ni and C are combined with each other. Therefore, the first and second nickel layers 201 and 203 containing the impurities have less crystallization than the pure nickel layer 202 and the impurities are randomly distributed. Thus, the nickel layer 201 firstly grows in the second-dimensional direction to form a planar surface and then a deposition process is performed. Thus, a film layer with the planar surface is formed.

Since the first and second nickel layers 201 and 203 containing the impurities has relatively less chemical bondings than the pure nickel layer because of the Ni—C coupling, the oxidation is prevented.

The electrode with a stack structure comprising the first nickel layer 201 containing impurities, the pure nickel layer 202, and the second nickel layer 203 containing impurities is formed in a planar type. However, the electrode with a stack structure comprising the first nickel layer 201 containing impurities, the pure nickel layer 202, and the second nickel layer 203 containing impurities can be formed to have a planar type, a concave type, a cylinder type, a pillar type and a combination thereof.

The first nickel layer 201 containing impurities, the pure nickel layer 202, and the second nickel layer 203 containing impurities are formed through a Chemical Vapor Deposition (CVD) process or an Atomic Layer Deposition (ALD) process. The formation method through the ALD process will be described in more detail later by referring to FIG. 3.

Referring to FIG. 2B, an electrode with a stack structure of a pure nickel layer 211 and a nickel layer 212 containing impurities may be formed. The electrode can be applied to a gate electrode or at least one of an upper electrode and a lower electrode of a capacitor. The electrode may be applied to any other devices employing a high dielectric layer. Preferably, the stack structure of the pure nickel layer 211 and the nickel layer 212 containing the impurities may be applied to the lower electrode in the planar type capacitor.

Referring to FIG. 2C, an electrode with a stack structure of a nickel layer 221 containing impurities and a pure nickel layer 222 may be formed. The electrode can be applied to a gate electrode or at least one of an upper electrode and a lower electrode of a capacitor. The electrode may be applied to any other devices employing a high dielectric layer. Particularly, the stack structure of the nickel layer 221 containing the impurities and the pure nickel layer 222 may be applied to the upper electrode of a planar type capacitor.

Figure 3:
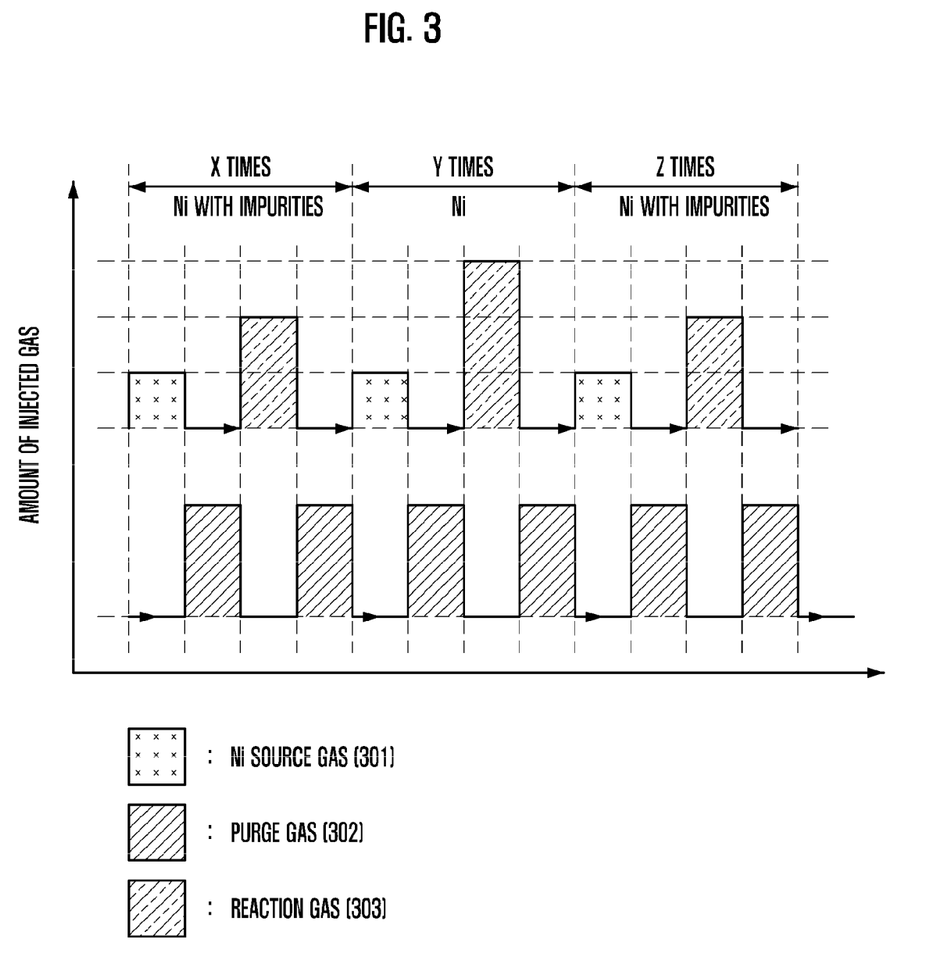
FIG. 3 is a timing diagram illustrating a method for forming the electrode in accordance with an embodiment.

FIG. 3 is a timing diagram illustrating a method for forming the electrode in accordance with an embodiment. The method for forming the electrode illustrated in FIG. 2A will be described referring to FIG. 3 hereafter for the sake of convenience in explaining the embodiments.

According to the ALD process, a source gas is provided to be chemically adsorbed to a surface of a substrate, and a purge gas flows to purge the physically extra-adsorbed sources. A reaction gas is provided to a source in one layer to cause a chemical reaction between the source in one layer and the reaction gas to thereby deposit an atomic film layer. The ALD process is performed in a surface reaction mechanism to form a stable and even film layer. Thus, the method can be applied to a process for forming a structure with high step coverage (or a big height difference) and a low design rule.

Furthermore, since the source gas and the reaction gas are separated, sequentially provided and purged, the ALD process generates less particles caused by a gas phase reaction than the CVD process.

Referring to FIG. 3, the first nickel layer containing the impurities, the pure nickel layer, and the second nickel layer containing the impurities are formed in sequence through the ALD process.

Herein, each layer is formed in-situ or ex-situ. Particularly, when the layer is formed in-situ, the quantity of the reaction gas for forming the layer is controlled to form the pure nickel layer, the first nickel layer containing the impurities and the second nickel layer containing the impurities. For instance, when the source gas flows at a rate of approximately 50 sccm to approximately 1,000 sccm, the reaction gas is controlled to flow at a rate of approximately 3,000 to approximately 5,000 sccm to form the pure nickel layer and at a rate of approximately 100 sccm to approximately 3,000 sccm to form the first and the second nickel layers.

First to third unit cycles are sequentially performed to form the first nickel layer containing the impurities, the pure nickel layer, and the second nickel layer containing impurities. Particularly, each unit cycle is repeatedly performed X, Y, and Z times, respectively to adjust thicknesses of the above layers.

The ALD process may be performed at a temperature of approximately 200° C. to approximately 500° C.

Each of the first to third unit cycles is performed in a sequence of source gas/purge gas/reaction gas/purge gas.

The first unit cycle for forming the first nickel layer containing the impurities includes injection of nickel source gas 301, injection of purge gas 302, injection of reaction gas 303, and injection of purge gas 302.

The injection of the nickel source gas 301 flows nickel organic precursor at a rate of approximately 50 sccm to approximately 1,000 sccm for approximately 0.1 second to approximately 10 seconds by using carrier gas such as nitrogen ($N_2$) or argon (Ar). Here, the nickel organic precursor may be $NiCO_3$.

The injection of the purge gas 302 is performed after the injection of the source gas 301 and the injection of the reaction gas 303. In the injection of the purge gas 302, the $N_2$ gas flows into a deposition chamber at a rate of approximately 100 sccm to approximately 2,000 sccm for approximately 1 second to approximately 10 seconds to remove the remaining nickel source gas or reaction gas in the chamber.

The injection of the reaction gas 303 is performed to form the first nickel layer containing the impurities. The reaction gas, that is, $H_2$ or $NH_3$ flows into the deposition chamber at rate of approximately 100 sccm to approximately 3,000 sccm for 1 second to 10 seconds to form the first nickel layer containing the impurities. Particularly, the reaction gas is adjusted to form the first nickel layer containing the impurities. Here, the reaction gas is injected less than that required for forming the pure nickel layer to prevent the reaction of the impurities in the nickel source gas. A portion of the impurities is removed and the remaining impurities are included in the film layer. Thus, the first nickel layer containing the impurities is formed.

As described above, the first unit cycle is repeatedly performed X times to form the first nickel layer containing the impurities with a desired thickness.

The second unit cycle for forming the pure nickel layer includes injection of nickel source gas 301, injection of purge gas 302, injection of reaction gas 303, and injection of purge gas 302.

The injection of the nickel source gas 301 flows nickel organic precursor at a rate of approximately 50 sccm to approximately 1,000 sccm for approximately 0.1 second to approximately 10 seconds by using carrier gas such as $N_2$ or Ar. Here, the nickel organic precursor may be $NiCO_3$.

The injection of the purge gas 302 is performed after the injection of the source gas 301 and the injection of the reaction gas 303. In the injection of the purge gas 302, the $N_2$ gas flows into a deposition chamber at a rate of approximately 100 sccm to approximately 2,000 sccm for approximately 1 second to approximately 10 seconds to remove the remaining nickel source gas or reaction gas in the chamber.

The injection of the reaction gas 303 is performed to form the pure nickel layer. The reaction gas, which is $H_2$ or $NH_3$, flows into the deposition chamber at rate of approximately 3,000 sccm to approximately 5,000 sccm for 1 second to 10 seconds to form the pure nickel layer containing the impurities. Particularly, the reaction gas is adjusted sufficiently to form the pure nickel layer. Here, the reaction gas is injected in a sufficient amount that all the impurities in the nickel source gas react off. Therefore, the reaction gas is injected in a rate of approximately 3,000 sccm to approximately 5,000 sccm.

A second unit cycle described above is repeatedly performed Y times to form the pure nickel layer with a desired thickness.

The second nickel layer containing the impurities is formed in the same order that the first nickel layer containing the impurities is formed.

The second nickel layer containing the impurities is formed by repeatedly performing a third unit cycle Z times.

Particularly, each of the first to third unit cycles is repeatedly performed X, Y, and Z times to adjust the thickness of each layer and sequentially performed in order of stack.

Furthermore, in the ALD process, $N_2$ or $NH_3$ plasma may be applied to increase the deposition speed.

Figure 4:
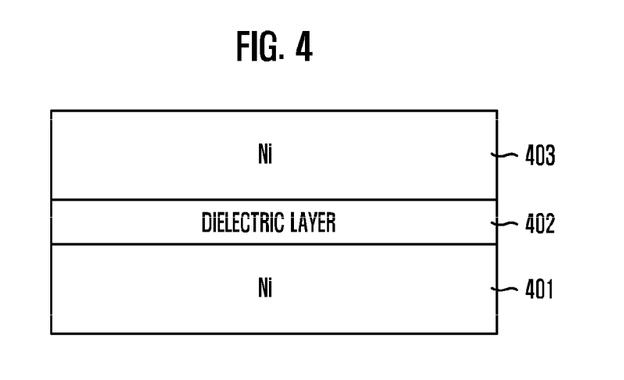
FIG. 4 is a cross-sectional view illustrating a capacitor in accordance with an embodiment.

FIG. 4 is a cross-sectional view illustrating a capacitor in accordance with an embodiment.

Referring to FIG. 4, a capacitor with a stack structure of a first electrode 401, a dielectric layer 402, and a second electrode 403 is formed. Here, the first electrode 401 and the second electrode 403 may include the nickel layer containing the impurities described above referring to FIG. 1. The first electrode 401 and the second electrode 403 may be formed to have a combination of the nickel layer containing the impurities and the pure nickel layer. The combination of the nickel layer containing the impurities and the pure nickel layer may include a stack structure described above referring to FIGS. 2A to 2C.

Here, the impurities include carbon (C) or hydrogen (H). The impurities occupy approximately 5% to approximately 50% of the nickel layer.

The first and the second electrodes 401 and 403 are formed through the CVD process or the ALD process.

The first and the second electrodes 401 and 403 can be formed to have a planar type, a pillar type, a concave type, a cylinder type, or a combination thereof.

Figure 5:
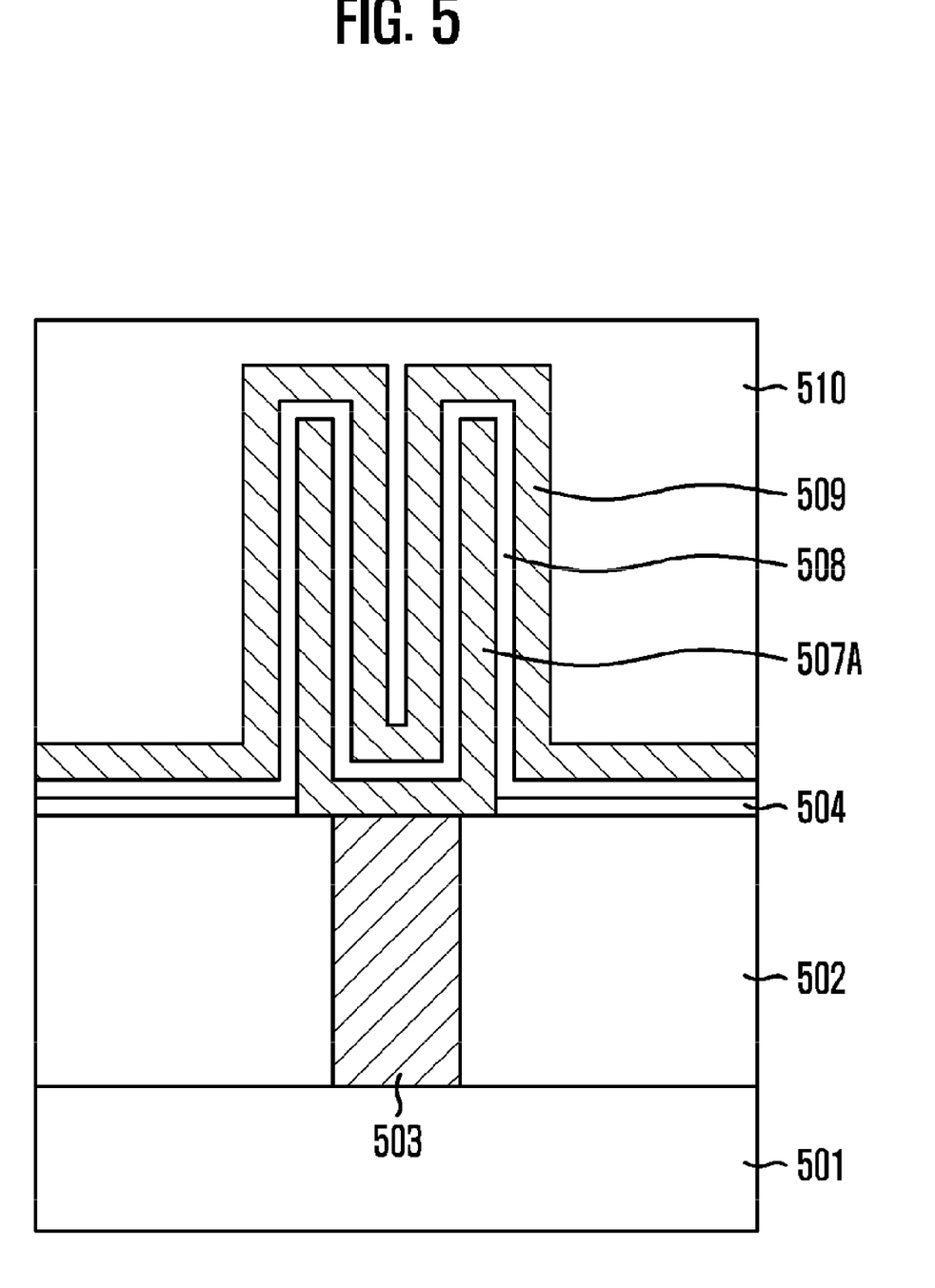
FIG. 5 is a cross-sectional view illustrating a cylinder type capacitor in accordance with an embodiment.

FIG. 5 is a cross-sectional view illustrating a cylinder type capacitor in accordance with an embodiment.

Referring to FIG. 5, an inter-layer dielectric layer 502 is formed over a substrate 501. A storage node contact plug 503 is formed through the inter-layer dielectric layer 502 to be connected to a region in the substrate 501. An etch stop layer 504 is formed over the inter-layer dielectric layer 502 and patterned to open the storage node contact plug 503. A cylinder type lower electrode 507A is formed over the storage node contact plug 503. A dielectric layer 508 is formed over the cylinder type lower electrode 507A. A first upper electrode 509 and a second upper electrode 510 are formed over the dielectric layer 508.

The cylinder type lower electrode 507A and the first upper electrode 509 are formed of the nickel layer containing the impurities described above referring to FIG. 1 or the combination of the nickel layer containing the impurities and the pure nickel layer described above referring to FIGS. 2A to 2C. Preferably, the cylinder type lower electrode 507A and the first upper electrode 509 are formed to have the structure illustrated in FIG. 2A.

The dielectric layer 508 may include a high-k material. The high-k material may include $TiO_2$, $SrTiO_2$, or $BaSbTiO_3$. Here, the lower electrode 507A is preferably formed to have the structure illustrated in FIG. 2A. Thus, an adhesion force of the lower electrode 507A with the dielectric layer 508 is improved and the crystal growth of the dielectric layer 508 is also improved. Further, during the dielectric layer 508 is deposited, the lower electrode 207A is not oxidized.

FIGS. 6A to 6E are cross-sectional views illustrating a method for fabricating a cylinder type capacitor in accordance with an embodiment.

Figure 6A:
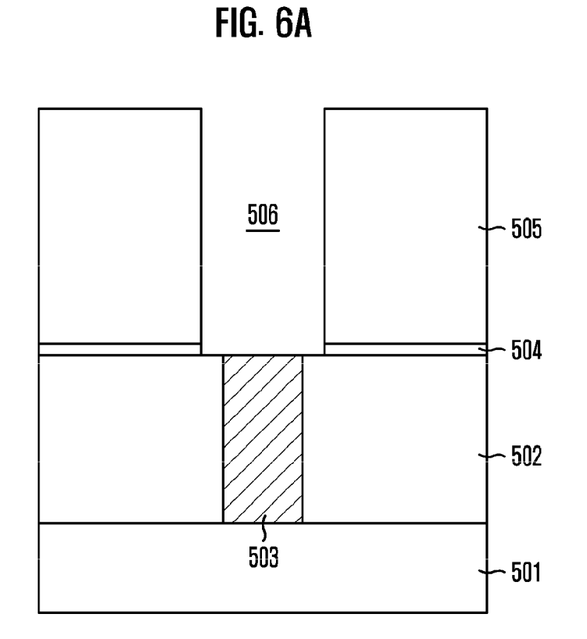
FIGS. 6A to 6E are cross-sectional views illustrating a method for fabricating a cylinder type capacitor in accordance with an embodiment.

Referring to FIG. 6A, an inter-layer dielectric layer 502 is formed over a substrate 501. The substrate 501 may be a semiconductor substrate where a DRAM process is performed or a substrate where a certain process for forming gate patterns or bit line patterns is completed. The inter-layer dielectric layer 502 insulates the substrate 501 from the upper capacitor. The inter-layer dielectric layer 502 may includes an oxide layer of an HDP (High Density Plasma) oxide layer, a BPSG (Boron Phosphorus Silicate Glass) layer, a PSG (Phosphorus Silicate Glass) layer, a BSG (Boron Silicate Glass) layer, a TEOS (Tetra Ethyle Ortho Silicate) layer, an USG (Un-doped Silicate Glass) layer, an FSG (Fluorinated Silicate Glass) layer, a CDO (Carbon Doped Oxide) layer, an OSG (Organo Silicate Glass) layer or a combination thereof such as a stack structure including one or more of the foregoing. The oxide layer may include a layer coated by a spin coating method such as an SOD(Spin On Dielectric) layer.

A storage node contact plug 503 through the inter-layer dielectric layer 502 is formed to be connected to a region in the substrate 501. To be specific, the inter-layer dielectric layer 502 is etched to form a contact hole exposing the substrate 501. A conductive material is formed to fill the contact hole and then an etch process is performed until the surface of the inter-layer dielectric layer 502 is exposed.

The conductive material may include a transition metal layer, a rare earth metal layer, a transition metal silicide, a rare earth metal silicide, or an alloy thereof. The conductive material may include a polysilicon layer doped with impurity ions or have a stack structure of multi-layers. The conductive material may include a stack structure of at least two materials including the above conductive materials. When the storage node contact plug 503 includes a metal layer (which is the transition layer or the rare earth metal), a barrier metal layer (not shown) may be formed between the metal layer of storage node contact plug 503 and the contact hole.

An etch stop layer 504 is formed over the inter-layer dielectric layer 502. When the contact hole for a subsequent lower electrode is formed, the etch stop layer 504 stops the etch process to prevent the inter-layer dielectric layer 502 from being damaged. Furthermore, when a dip-out process for forming the cylinder type capacitor is performed, the etching solution is prevented from flowing into the inter-layer dielectric layer 502 by the etch stop layer 504. Thus, the etch stop layer 504 includes a material having an etch selectivity ratio with a subsequent sacrificial layer. The etch stop layer 504 may include a nitride layer such as a silicon nitride (SiN, $Si_3N_4$).

A sacrificial layer 505 is formed over the etch stop layer 504. In the sacrificial layer 505, a contact hole for the lower electrode is formed. The sacrificial layer 505 may include an oxide layer and may comprise one or more layers. The oxide layer may be an HDP oxide layer, a BPSG layer, a PSG layer, a BSG layer, a TEOS layer, an USG layer, an FSG layer, a CDO layer, an OSG layer or a combination thereof such as a stack structure of the foregoing. The oxide layer may include a layer coated by a spin coating method such as an SOD layer.

The sacrificial layer 505 and the etch stop layer 504 are etched to form a storage node hole 506 exposing the storage node contact hole 503. The storage node hole 506 defines a region where the lower electrode is formed. In detail, mask patterns are formed over the sacrificial layer 505, then the sacrificial layer 505 and the etch stop layer 504 are etched using the mask patterns as an etch barrier to form the storage node hole. For mask patterns, a photoresist layer is coated over the sacrificial layer 505 and patterned to open the region where the storage node contact hole is formed. A hard mask layer may be additionally formed before the photoresist layer is formed to secure an etch margin, which may not be sufficient only with the photoresist layer.

Figure 6B:
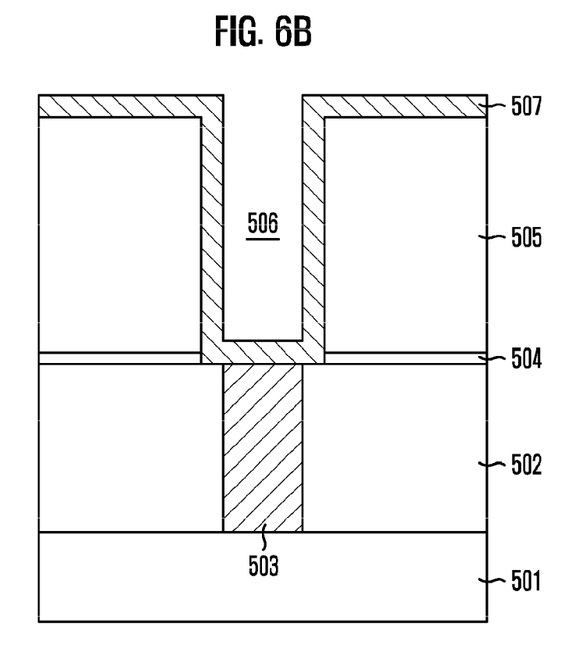

Referring to FIG. 6B, a lower electrode 507 including the nickel layer containing the impurities is formed over the resultant structure including the storage node hole 506. The lower electrode 507 including the nickel layer containing the impurities is formed through a CVD process or an ALD process. Preferably, the ALD process is performed to be applied to a structure having high step coverage or a big height difference. Thus, the ALD process in the timing diagram illustrated in FIG. 3 can be applied to form the structures described above referring to FIGS. 2A to 2C. Preferably, the lower electrode 507 is formed to have the structure illustrated in FIG. 2A to form the cylinder type capacitor.

The lower electrode 507 containing the impurities includes a first nickel layer containing impurities, a pure nickel layer, and a second nickel layer containing impurities as the structure illustrated in FIG. 2A. The pure nickel layer exhibits a high work function, low leakage current and an excellent adhesion force with other layers. Furthermore, the first and second nickel layers with the impurities are formed over and below the pure nickel layer. Thus, surface roughness of the pure nickel layer is improved and the surface oxidation during a subsequent dielectric layer formation process is prohibited.

A thermal treatment process is performed on the lower electrode 507 to increase crystallinity. The thermal treatment process may be a rapid thermal treatment process or furnace annealing process. A temperature for the thermal treatment process varies according to equipment. In this embodiment, the thermal treatment process is performed at a temperature of approximately 400° C. to approximately 800° C.

Figure 6C:
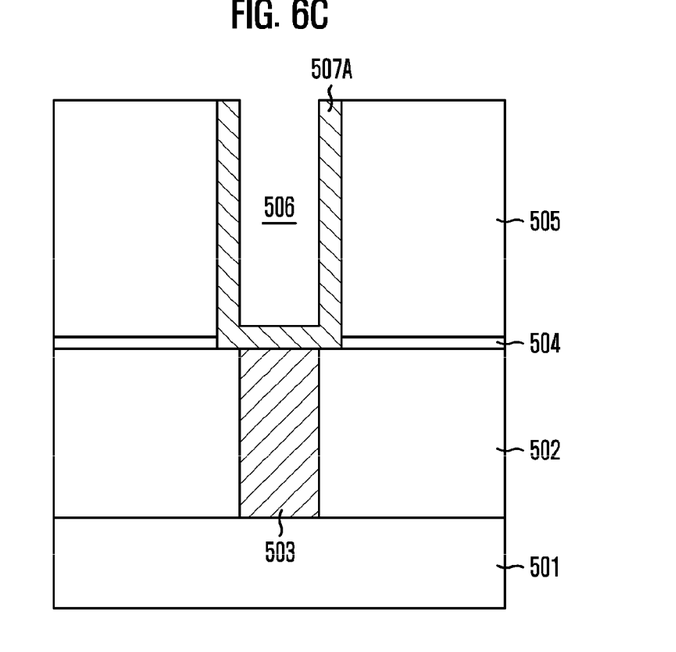

Referring to FIG. 6C, a lower electrode pattern 507A remains in the storage node hole 506, for example, by a planarization process. The planarization process may be a Chemical Mechanical Polishing (CMP) process or etch back process.

Figure 6D:
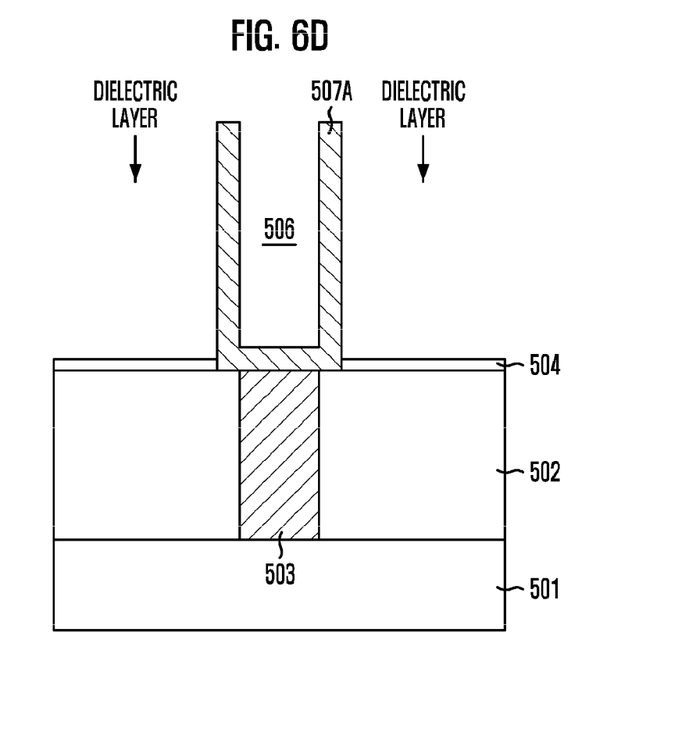

Referring to FIG. 6D, the sacrificial layer 505 (refer to FIG. 6C) is removed through a dip-out process. The dip-out process is performed using a Buffered Oxide Etchant (BOE) or Hydrogen Fluoride (HF). The etch stop layer 504 prevents the BOE or the HF from flowing into the inter-layer dielectric layer 502, thereby preventing a damage to the inter-layer dielectric layer 502 caused by the dip-out process. As a result, the cylinder type lower electrode 507A is formed.

Figure 6E:
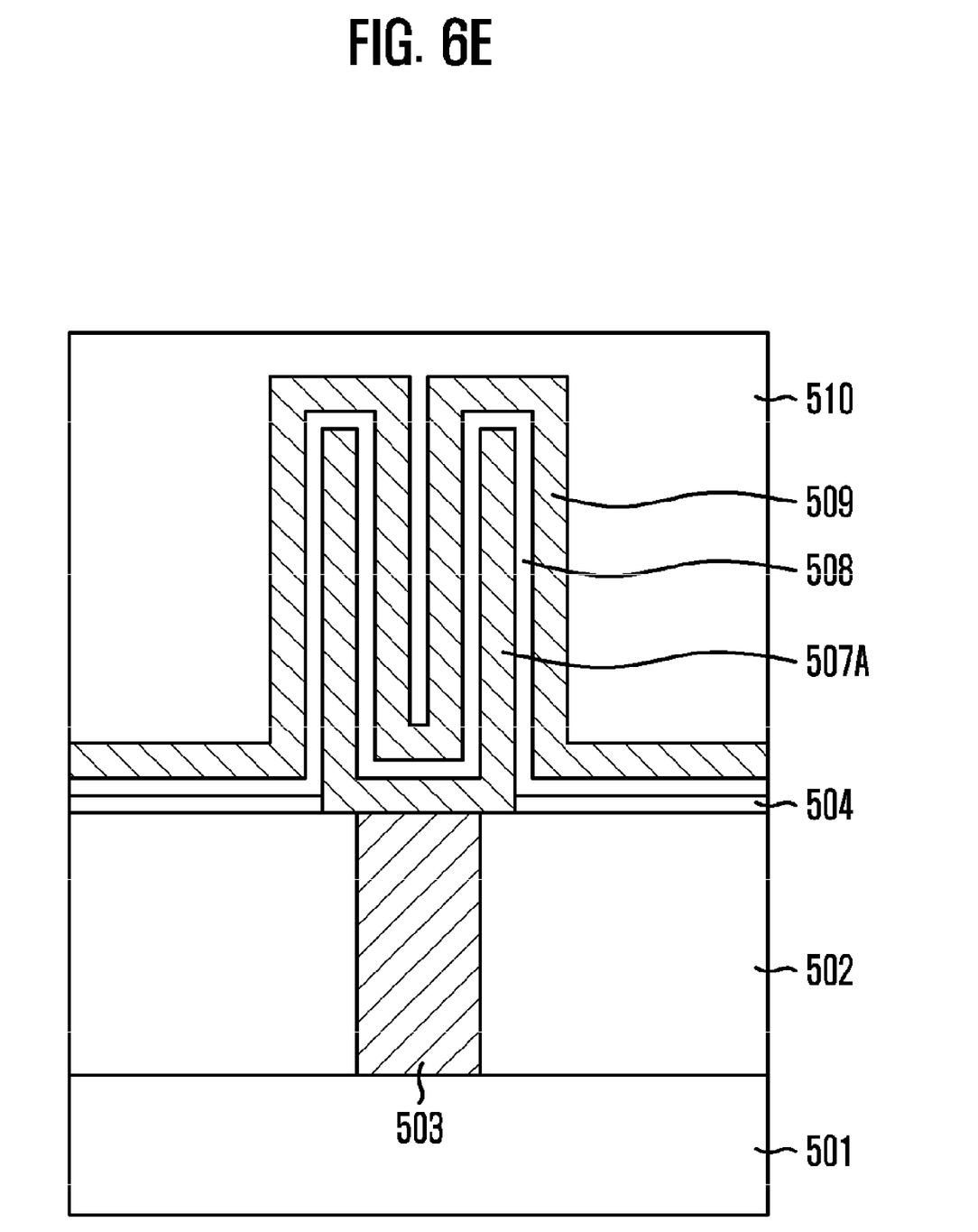

Referring to FIG. 6E, a dielectric layer 508 is formed over the resultant structure of FIG. 6D including the lower electrode 507A. The dielectric layer 508 may include a high dielectric material including, but not limited to, $TiO_2$, $SrTiO_2$ or $BaSbTiO_3$. The dielectric constant (k) of $TiO_2$ is 60 to 100, that of $SrTiO_2$ is 80 to 100 and that of $BaSbTiO_3$ is 100 to 300. $TiO_2$, $SrTiO_2$ and $BaSbTiO_3$ have a low energy band gap and a high dielectric constant. As described above referring to FIG. 6B, the lower electrode 507 containing the impurities exhibits excellent adhesion force, a high work function and improved surface roughness and oxidation characteristics of the pure nickel layer. Thus, a deterioration of the dielectric layer 508 with the high-k can be improved. Furthermore, crystallinity of the dielectric layer 508 can also be improved by the improved adhesion force.

Thereafter, a first upper electrode 509 and a second upper electrode 510 are formed over the dielectric layer 508. The first upper electrode 509 is formed by the same manner as that for forming the lower electrode pattern 507A. That is, the first upper electrode 509 is formed to include the nickel layer containing the impurities. After the formation of the first upper electrode 509, a thermal treatment process can be performed for the same reason as the thermal treatment of the lower electric 507A.

The second upper electrode 510 includes a titanium nitride (TiN) layer to be electrically connected. The second upper electrode 510 may be formed through the CVD process. The upper electrode may comprise only the first upper electrode 509 without forming the second upper electrode 510.

Figure 7:
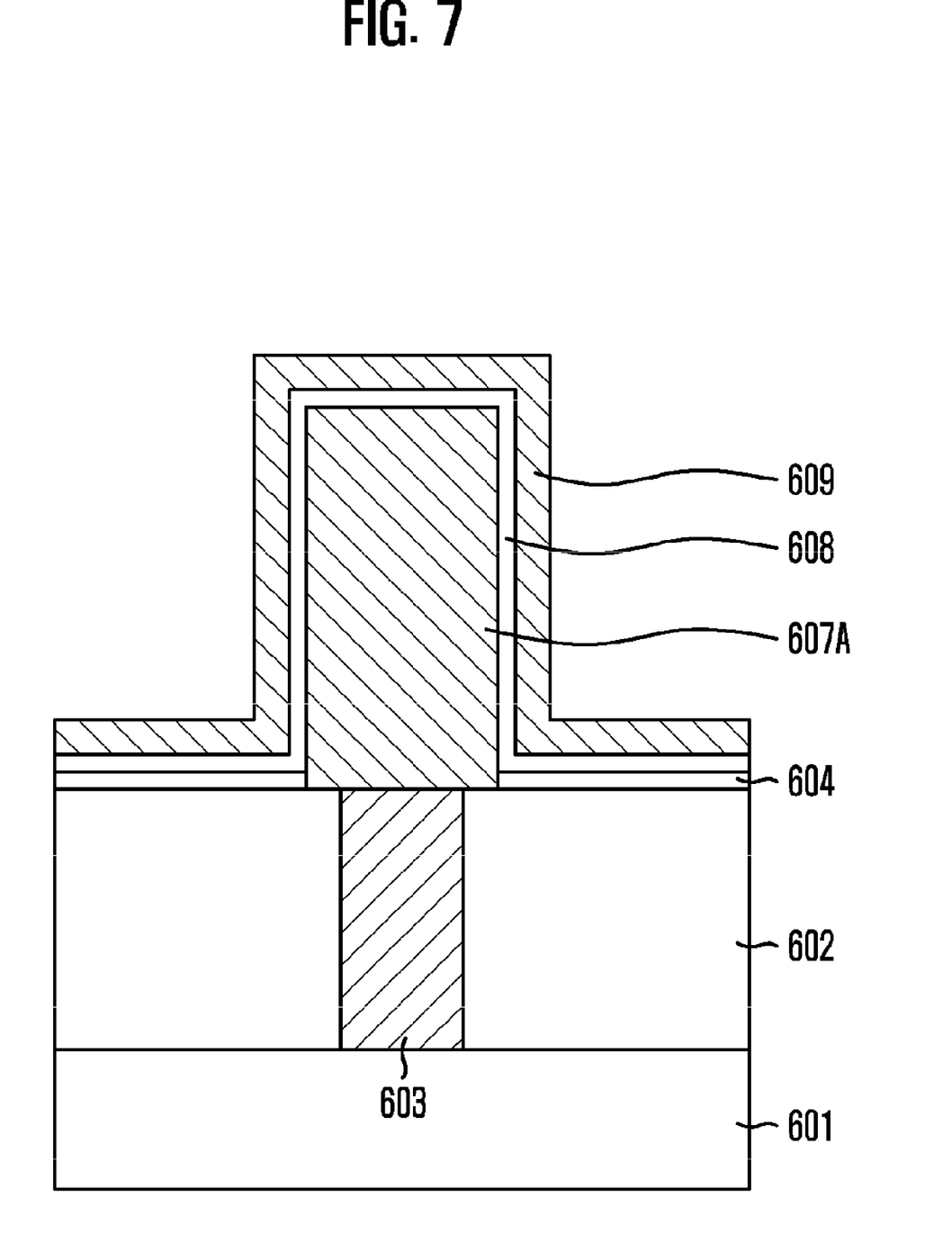
FIG. 7 is a cross-sectional view illustrating a pillar type capacitor in accordance with an embodiment.

FIG. 7 is a cross-sectional view illustrating a pillar type capacitor in accordance with another embodiment.

Referring to FIG. 7, an inter-layer dielectric layer 602 is formed over a substrate 601. A storage node contact plug 603 passing through the inter-layer dielectric layer 602 is formed to be connected to a region the substrate 601. An etch stop layer 604 is formed over the inter-layer dielectric layer 602 and patterned to open the storage node contact plug 603. A pillar type lower electrode 607A is formed over the storage node contact plug 603. A dielectric layer 608 is formed over the pillar type lower electrode 607A over which an upper electrode 609 is formed.

The pillar type lower electrode 607A and the upper electrode 609 may be formed to have the structure illustrated in FIG. 1 or FIGS. 2A to 2C. Preferably, the pillar type lower electrode 607A may be formed to have the structure illustrated in FIG. 2A.

The dielectric layer 608 may include a high-k material. The high-k material may include $TiO_2$, $SrTiO_2$, or $BaSbTiO_3$. Here, the lower electrode 607A is formed to have the structure illustrated in FIG. 2A. Thus, an adhesion force of the lower electrode 607A with the dielectric layer 608 is improved and the crystal growth of the dielectric layer 608 is also improved. Further, during the dielectric layer 608 is deposited, the lower electrode 607A is not oxidized.

FIGS. 8A to 8E are cross-sectional views illustrating a method for fabricating a pillar type capacitor in accordance with an embodiment. The same reference numerals of FIG. 7 are used in FIGS. 8A to 8E for the sake of convenience in description.

Figure 8A:
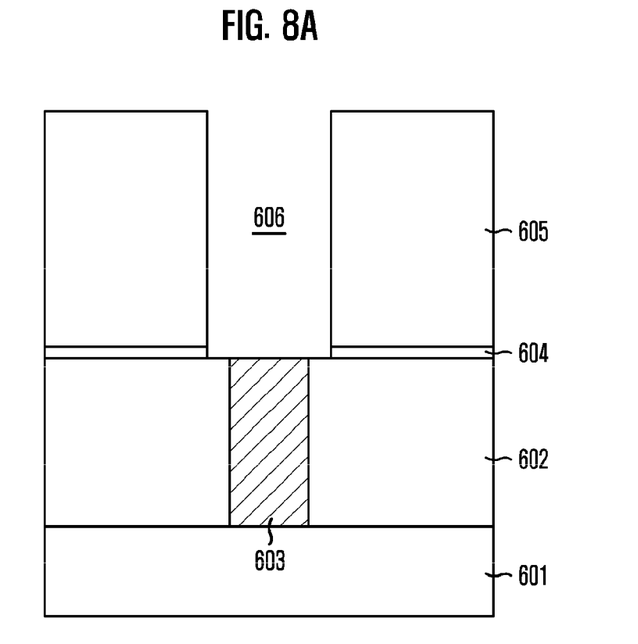
FIGS. 8A to 8E are cross-sectional views illustrating a method for fabricating a pillar type capacitor in accordance with an embodiment.

Referring to FIG. 8A, an inter-layer dielectric layer (ILD) 602 is formed over a substrate 601. The substrate 601 may be a semiconductor substrate where a DRAM process is performed or a substrate where a certain process for forming gate patterns or bit line patterns is completed. The inter-layer dielectric layer 602 insulates the substrate 601 from the upper capacitor. The inter-layer dielectric layer 602 may include an oxide layer of an HDP oxide layer, a BPSG layer, a PSG layer, a BSG layer, a TEOS layer, an USG layer, an FSG layer, a CDO layer, an OSG layer or a combination thereof such as a stack structure including one or more of the foregoing. The oxide layer may include a layer coated by a spin coating method such as an SOD layer.

A storage node contact plug 603 through the inter-layer dielectric layer 602 is formed to be connected to a region in the substrate 601. To be specific, the inter-layer dielectric layer 602 is etched to form a contact hole exposing the substrate 601. A conductive material is formed to fill the contact hole and then an etch process is performed until a surface of the inter-layer dielectric layer 602 is exposed.

The conductive material may include a transition metal layer, a rare earth metal layer, a transition metal silicide, a rare earth metal silicide, or an alloy thereof. The conductive material may include a polysilicon layer doped with impurity ions or have a stack structure of multi-layers. When the storage node contact plug 603 includes a metal layer (the transition metal, the rare earth metal), a barrier metal layer (not shown) may be additionally formed between the storage node contact 603 and the contact hole.

An etch stop layer 604 is formed over the inter-layer dielectric layer 602. When the contact hole for a subsequent lower electrode is formed, the etch stop layer 604 stops the etch process to prevent the inter-layer dielectric layer 602 from being damaged. Furthermore, when a dip-out process for forming the pillar type capacitor is performed, the etching solution is prevented from flowing into the inter-layer dielectric layer 602 by the etch stop layer 605. Thus, the etch stop layer 604 includes a material having an etch selectivity ratio with a subsequent sacrificial layer. The etch stop layer 604 may be a nitride layer including a silicon nitride such as SiN, $Si_3N_4$.

A sacrificial layer 605 is formed over the etch stop layer 604. In the sacrificial layer 605, a contact hole for the lower electrode is formed. The sacrificial layer 605 may include an oxide layer and may comprise one layer or multi-layers. The oxide layer may be an HDP oxide layer, a BPSG layer, a PSG layer, a BSG layer, a TEOS layer, an USG layer, an FSG layer, a CDO layer, an OSG layer or a combination thereof such as a stack structure of the foregoing. The oxide layer may include a layer coated by a spin coating method such as an SOD layer.

The sacrificial layer 605 and the etch stop layer 604 are etched to form a storage node hole 606 exposing the storage node contact hole 603. The storage node hole 606 defines a region where the lower electrode is formed. In detail, mask patterns are formed over the sacrificial layer 605, then the sacrificial layer 605 and the etch stop layer 604 are etched using the mask patterns as an etch barrier to form the storage node hole. For mask patterns, a photoresist layer is coated over the sacrificial layer 605 and patterned to open the region where the storage node contact hole is formed. A hard mask layer may be additionally formed before the photoresist layer is formed to secure an etch margin which may not be sufficient only with the photoresist layer.

Figure 8B:
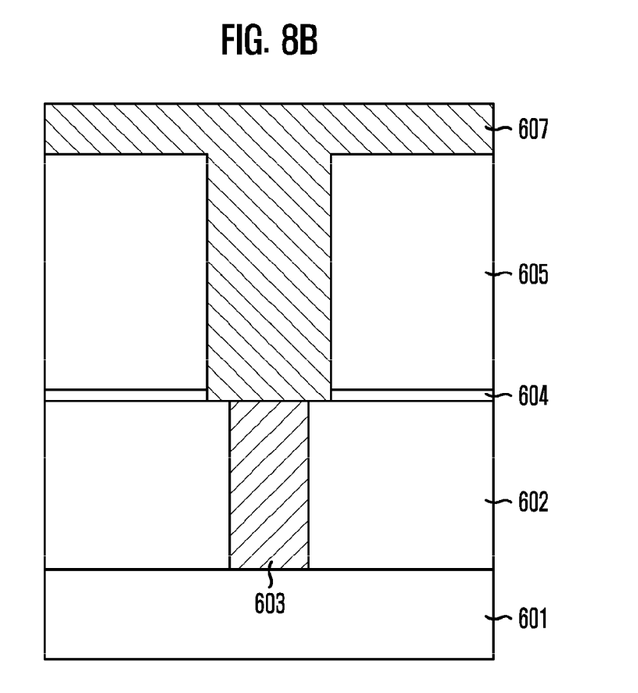

Referring to FIG. 8B, a lower electrode 607 including the nickel layer containing the impurities is formed over the resultant structure of FIG. 8A including the storage node hole 606. The lower electrode 607 including the nickel layer containing the impurities is formed through a CVD process or an ALD process. The ALD process may be performed to be applied to a structure having high step coverage or a big height difference. Thus, the ALD process in the timing diagram illustrated in FIG. 3 can be applied to form the structures described above referring to FIGS. 2A to 2C. Preferably, the lower electrode 607 is formed to have the structure illustrated in FIG. 2A to form the pillar type capacitor.

The lower electrode 607 containing the impurities includes a first nickel layer containing impurities, a pure nickel layer, and a second nickel layer containing impurities as the structure illustrated in FIG. 2A. The pure nickel layer exhibits a high work function, low leakage current and an excellent adhesion force to other layers. Furthermore, the first and second nickel layers with the impurities are formed over and below the pure nickel layer. Thus, surface roughness of the pure nickel layer is improved and the surface oxidation during a subsequent dielectric layer formation process is prohibited.

A thermal treatment process is performed on the lower electrode 607 to increase crystallinity. The thermal treatment process may be a rapid thermal treatment process or furnace annealing process. A temperature for the thermal treatment process varies according to equipment. In this embodiment, the thermal treatment process is performed at a temperature of approximately 400° C. to approximately 800° C.

Figure 8C:
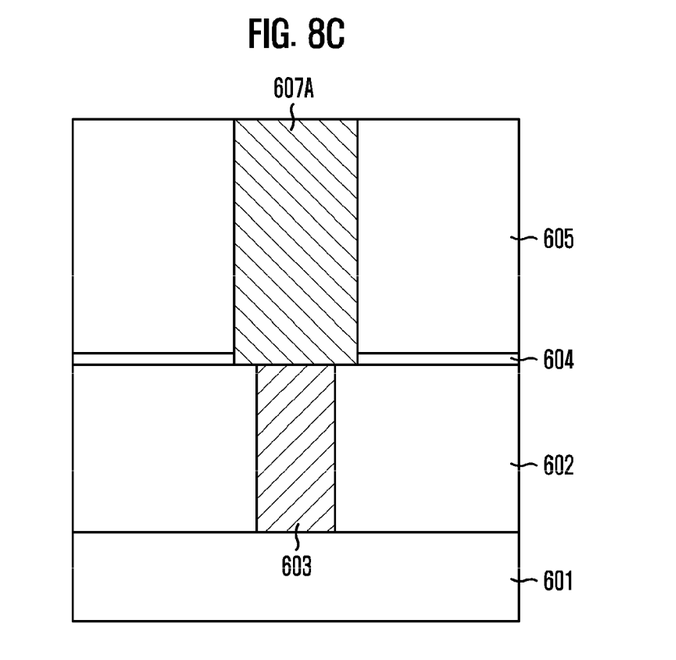

Referring to FIG. 8C, a lower electrode pattern 607A remains in the storage node hole 606, for example, by a planarization process. The planarization process may be a CMP process or etch back process.

Figure 8D:
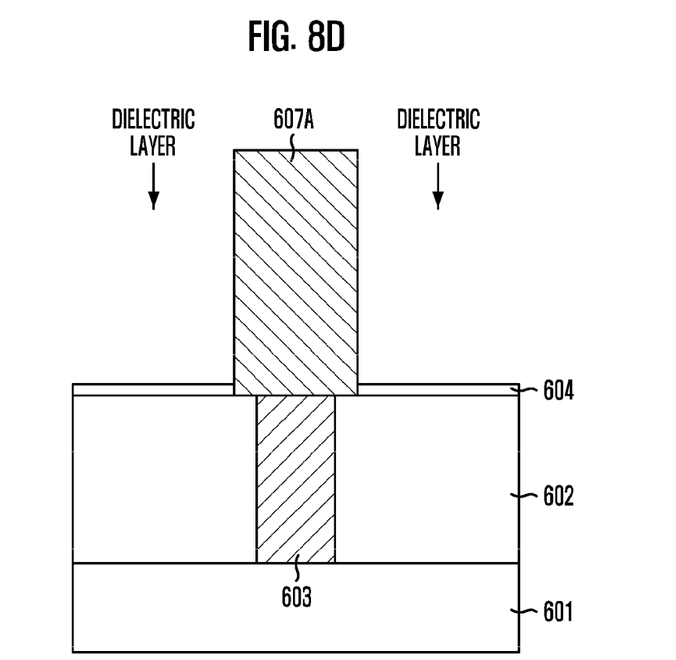

Referring to FIG. 8D, the sacrificial layer 605 (refer to FIG. 8C) is removed through a dip-out process. The dip-out process is performed using a BOE or HF. The etch stop layer 604 prevents the BIE or the HF from flowing into the inter-layer dielectric layer 602, thereby preventing a damage to the inter-layer dielectric layer 602 caused by the dip-out process. As a result, the pillar type lower electrode 607A is formed.

Figure 8E:
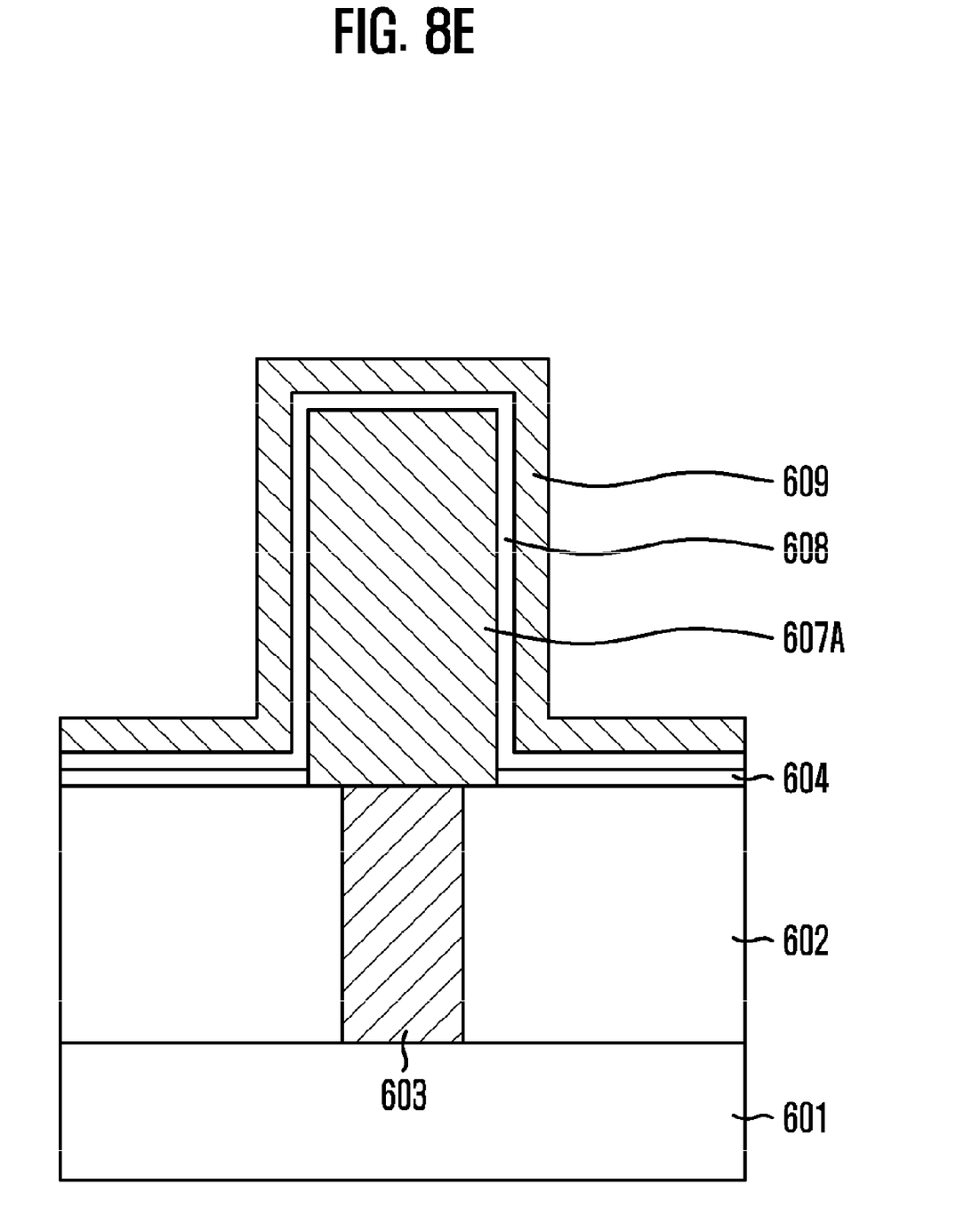

Referring to FIG. 8E, a dielectric layer 608 is formed over the resultant structure of FIG. 8D including the lower electrode 607A. The dielectric layer 608 may include a high-k material including, but not limited to, $TiO_2$, $SrTiO_2$ or $BaSbTiO_3$. The dielectric constant (k) of $TiO_2$ is 60 to 100, that of $SrTiO_2$ is 80 to 100 and that of $BaSbTiO_3$ is 100 to 300. $TiO_2$, $SrTiO_2$ and $BaSbTiO_3$ have low energy band gap and a very high dielectric constant. As described above referring to FIG. 8B, the lower electrode 607 containing the impurities exhibits excellent adhesion force, a high work function, and improved surface roughness and oxidation characteristics of the pure nickel layer. Thus, a deterioration of the dielectric layer 608 with the high-k can be improved. Furthermore, crystallinity of the dielectric layer 608 can also be improved by the improved adhesion force.

Thereafter, an upper electrode 609 is formed over the dielectric layer 608. The upper electrode 609 is formed by the same manner with that for forming the lower electrode 607A. That is, the upper electrode 609 is formed to include the nickel layer containing the impurities. After the upper electrode 609 is formed, a thermal treatment process is performed for the same reason as the thermal treatment of the lower electrode pattern 607A.

While embodiments have been described with reference to the pillar type and the cylinder type capacitors and the method for fabricating the same, changes and modifications can be made to be applied to a planar type capacitor and a concave type capacitor. Furthermore, changes and modifications can be made to be applied to any other electrodes in the devices applying a high-k layer, improving the leakage current characteristics, as well as any other electrodes requiring a low resistivity and a high work function.

While one or more embodiments been described it will be apparent to those skilled in the art that various changes and modifications may be made.

What is claimed is:

1. A method for fabricating a capacitor, comprising:
   forming a first electrode;
   forming a dielectric layer over the first electrode; and
   forming a second electrode over the dielectric layer,
   wherein one of the first electrode and the second electrode includes a nickel layer with impurities,
   wherein the impurities include carbon,
   wherein a concentration of the carbon in the nickel layer with the impurities ranges from 5% to 50%,
   wherein one of the first electrode and the second electrode has a combination of a pure nickel layer and the nickel layer with the impurities, and
   wherein the pure nickel layer and the nickel layer with the impurities are formed through a Chemical Vapor Deposition (CVD) process or an Atomic Layer Deposition (ALD) process.

2. The method of claim 1, wherein the first electrode or the second electrode is a plate type, a concave type, a cylinder type or a pillar type.

3. The method of claim 1, wherein the nickel layer with the impurities is formed to be in contact with the dielectric layer.

4. The method of claim 1, wherein the pure nickel layer and the nickel layer with the impurities are formed In-situ or Ex-situ.

5. The method of claim 1, wherein the first electrode or the second electrode has a stack structure of a first nickel layer with the impurities, the pure nickel layer, and a second nickel layer with the impurities.

6. The method of claim 1, wherein the pure nickel layer and the nickel layer with the impurities are formed through the ALD process using a nickel precursor and a reaction gas.

7. The method of claim 6, wherein the nickel precursor flows at a rate of 50 sccm to 1,000 sccm; the reaction gas flows at a rate of 100 sccm to 3,000 sccm for formation of the nickel layer with the impurities; and the reaction gas flows at a rate of 3,000 sccm to 5,000 sccm for formation of the pure nickel layer.

8. The method of claim 6, wherein the reaction gas includes $H_2$ or $NH_3$.

9. The method of claim 6, wherein $H_2$ plasma or $NH_3$ plasma is applied during the ALD process.

10. The method of claim 6, wherein the nickel precursor is a nickel organic precursor.

11. The method of claim 10, wherein the nickel precursor is $NiCO_3$.

12. The method of claim 6, wherein the ALD process is performed at a temperature of approximately 200 °C. to approximately 500 °C.

* * * * *